US012392817B2

(12) United States Patent
Hsue et al.

(10) Patent No.: US 12,392,817 B2
(45) Date of Patent: Aug. 19, 2025

(54) ELECTRONIC ASSEMBLY CARRIER WITH BUILT-IN SHUNT

(71) Applicant: NVIDIA CORPORATION, Santa Clara, CA (US)

(72) Inventors: Eugene Yan Ki Hsue, San Ramon, CA (US); Sahba Etaati, Los Altos, CA (US)

(73) Assignee: Nvidia Corporation, Santa Clara, CA (US)

( * ) Notice: Subject to any disclaimer, the term of this patent is extended or adjusted under 35 U.S.C. 154(b) by 173 days.

(21) Appl. No.: 18/012,608

(22) PCT Filed: Jun. 22, 2021

(86) PCT No.: PCT/US2021/038469
§ 371 (c)(1),
(2) Date: Dec. 22, 2022

(87) PCT Pub. No.: WO2021/262711
PCT Pub. Date: Dec. 30, 2021

(65) Prior Publication Data
US 2023/0251301 A1 Aug. 10, 2023

Related U.S. Application Data

(60) Provisional application No. 63/043,069, filed on Jun. 23, 2020.

(51) Int. Cl.
*G01R 31/28* (2006.01)
(52) U.S. Cl.
CPC ................. *G01R 31/2808* (2013.01)

(58) Field of Classification Search
CPC .................................................. G01R 31/2808
See application file for complete search history.

(56) References Cited

U.S. PATENT DOCUMENTS

| | | | |
|---|---|---|---|
| 4,019,094 A * | 4/1977 | Dinger | H01L 23/60 |
| | | | 439/511 |
| 4,914,552 A | 4/1990 | Kecmer | |
| 6,083,026 A | 7/2000 | Trout et al. | |
| 6,219,251 B1 | 4/2001 | Wang | |
| 6,496,025 B1 | 12/2002 | Stadelmayer et al. | |
| 2008/0076298 A1 * | 3/2008 | Matsumura | H01R 31/06 |
| | | | 439/584 |
| 2008/0080157 A1 | 4/2008 | Duppong et al. | |
| 2015/0153765 A1 * | 6/2015 | Filson | H05K 5/0226 |
| | | | 361/679.03 |
| 2020/0200796 A1 * | 6/2020 | Concepcion | G01R 31/2865 |
| 2021/0344130 A1 * | 11/2021 | Li | H01R 12/7076 |

* cited by examiner

*Primary Examiner* — Akm Zakaria
(74) *Attorney, Agent, or Firm* — Hogan Lovells US LLP

(57) ABSTRACT

A carrier (220) for insertion of a device under test (210) into a tester (110) includes engagement structures (226, 234) and an integrated activator (236). The engagement structures (226, 234) are shaped to engage and hold the device under test (210) in the carrier (220) for insertion in tester (110). The activator (236) is positioned to automatically contact and activate a configuration component on the device under test (210). The activator (236) may particularly include a shunt positioned to electrically contact and short together configuration pins (216). The shorting or other activation sets an operating mode of the device under test (210) during testing.

17 Claims, 6 Drawing Sheets

ELECTRONIC ASSEMBLY CARRIER WITH BUILT-IN SHUNT

CROSS-REFERENCE TO RELATED APPLICATION

This application is a 371 National Stage Entry of International Application No. PCT/US21/38469, filed Jun. 22, 2021, which in turn claims priority to U.S. Provisional Application No. 63/043,069, filed Jun. 23, 2020, both titled ELECTRONIC ASSEMBLY CARRIER WITH BUILT-IN SHUNT.

BACKGROUND

Devices being manufactured commonly require testing to prove the devices are working properly before the devices may be sold. Manufactures commonly test devices in bulk in dedicated test systems that may be able to test many devices at the same time. Testing of a batch of electronic assemblies such as printed circuit assemblies, for example, often includes installing one or more electronic assemblies into one or more carriers to create modules that are easily plugged into or removed from the test equipment. Testing may be complex for electronic assemblies that operate in different modes, particularly if the modes are selected through configuration of jumpers, switches, or similar manually installed or operated features. In such cases, testing of each electronic assembly during manufacture may require a tester to correctly set switches or jumpers for a test mode of the assembly or to set and reset the switches and jumpers for testing all operating modes of the assembly. The setting jumpers or switches for testing takes time and creates a risk that a jumper or switch could be set incorrectly during all or a portion of a test. Also, an assembly set to operate in a test mode for a test or diagnostic procedure needs to be switched back to a normal operational mode after the test or diagnostic procedure is complete. A failure to reset a device to an operational mode can result in a product that may be unready for sale or consumer use.

BRIEF DESCRIPTION OF THE DRAWINGS

FIG. 2-1 is an exploded view of a test module in accordance an example of the present disclosure.

FIG. 2-2 shows in more detail of the portion of a device under test that is used to switch the device under test to between functional modes.

FIG. 2-3 is a perspective view of an assembled test module in accordance with an example of the present disclosure.

FIG. 3 is a top view of a test system and particularly illustrates test sockets and guides in accordance with an example of the present disclosure.

The drawings illustrate examples for the purpose of explanation and are not of the invention itself. Use of the same reference symbols in different figures indicates similar or identical items.

DETAILED DESCRIPTION

Figure 1:
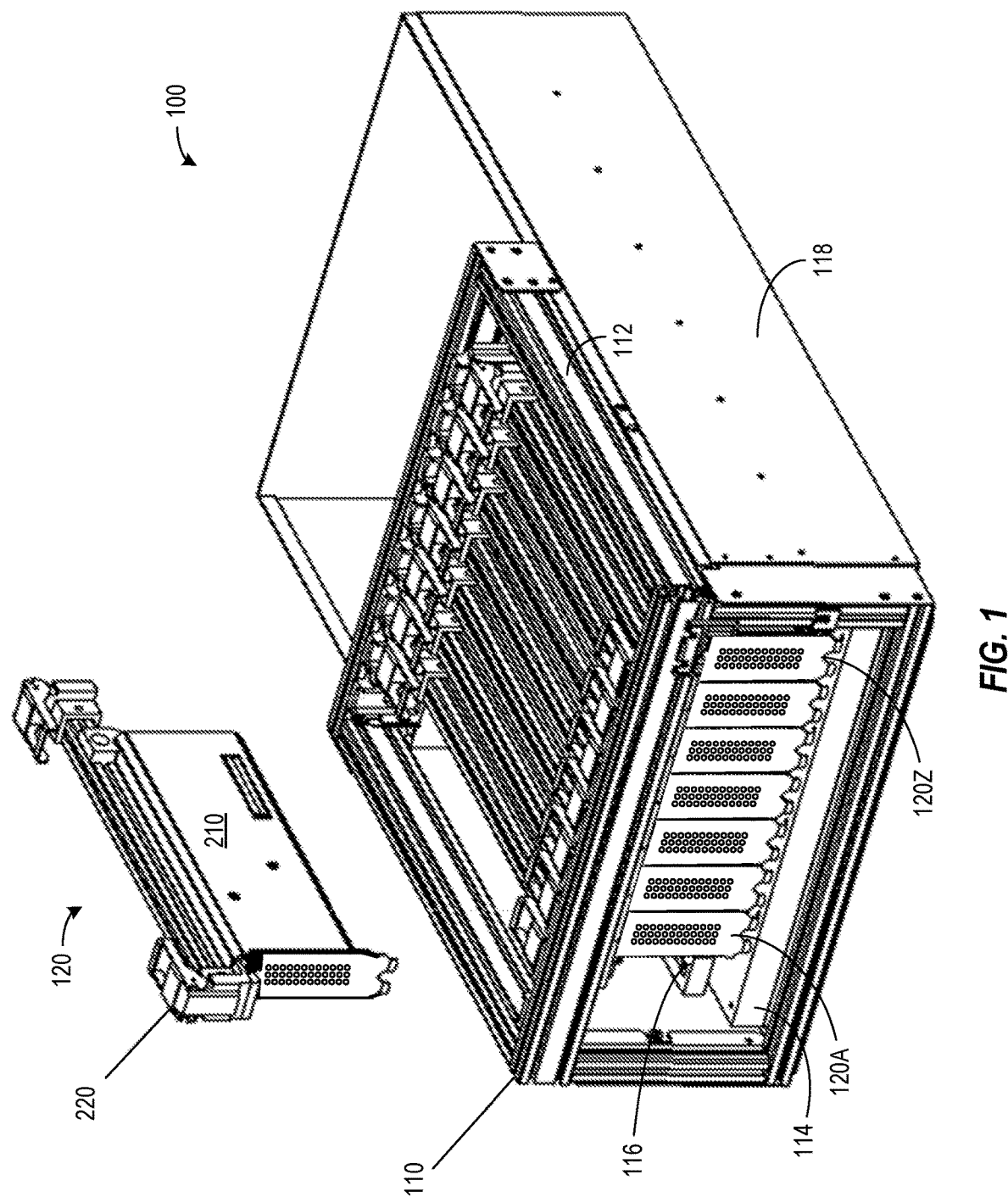
FIG. 1 is a perspective view of test modules and a test system in accordance with an example of the present disclosure.

In accordance with an aspect of the present disclosure, a carrier for an electronic assembly automatically configures the assembly to operate in a specific mode, e.g., a test mode, while the assembly is attached to the carrier and automatically returns the assembly to a unconfigured state when the assembly is removed from the carrier. In one example, the carrier includes a retainer that engages with an assembly, i.e., a device under test, to hold the assembly as part of a module suitable for insertion into a tester, and the retainer may include an activator such as a shunt that automatically contacts a configuration component of the assembly to set the assembly in a test mode while the carrier engages and holds the assembly.

Primary functions of a carrier are to protect a product during handling and to provide a compatible structure for insertion and removal the product in a test system. Conventionally, jumpers or switches on the product may need to be set to control the behavior of the product during testing or normal use, and conventional setting of the jumpers and switches is unrelated to and independent of whether the product is held in a carrier. A unique feature disclosed herein is the integration of one or more shunts in a carrier, so that mounting of an electronic assembly in the carrier automatically positions the shunt(s) to interact with a header of the electronic assembly and set the operating mode of the electronic assembly for testing.

In accordance with one aspect of the present disclosure, a carrier for insertion of a device under test into a test system includes engagement structures with an integrated activator such as a shunt. The engagement structures may be shaped to engage and hold the device under test in the carrier for insertion in a test system. The activator is integrated into the carrier and positioned to contact and activate a configuration component on the device under test, thereby setting an operating mode of the device under test during testing.

In accordance with a further aspect of the present disclosure, a carrier for a device under test includes a spine, an end fitting attached to the spine, and a retention clip mounted on the spine. The end fitting may include an engagement feature shaped to engage one portion of the device under test. The retention clip may be slide mounted on the spine and may include an engagement feature shaped to engage another portion of the device under test so that that carrier holds the device under test between the retention clip and the end fitting. The carrier further has an integrated activator such as shunt, e.g., on the end fitting or retention clip, at a position causing the activator to contact and activate a configuration component on the device under test when the carrier is engaged with the device under test.

A product such as an electronic assembly may operate under different modes for different applications or uses of the product or at different times during the life cycle of the product. During manufacturing, for example, the product may need to operate in a test mode so that all functions of the product may be tested in a test system. During customer use, the product may operate in one or more different normal operational modes. During troubleshooting, a defective or malfunctioning product may need to operate in the test mode or a diagnostic mode when the product undergoes analysis. Systems and methods disclosed herein may employ a carrier that holds or mounts a product such as an electronic assembly for testing and automatically configures a product for the proper testing mode without the need to attach a jumper or configure a switch. The product automatically returns to a normal operational mode when removed from the carrier.

FIG. 1 shows a test system 100 in accordance with one example of the present disclosure. Test system 100 includes a tester 110 with connectors 116 adapted to connect to test modules 120A to 120Z. Each of test modules 120 and 120A to 120Z includes an electronic assembly 210, which is the device under test. Electronic assemblies 210 may, for example, be computer or add-in cards, e.g., PCI-e cards, or other systems including printed circuit boards with connectors or contacts that, during normal operations, electrically connect to a host device, e.g., plug into slots in a standard peripheral interface such as a PCI bus in a host server or computer. In one specific example, connectors 116 include sockets or slots, and each electronic assembly 210 has a blind mate connector, where the blind mate connector has self-alignment features that tolerate small misalignments of electronic assembly 210 when mating, e.g., sliding or snapping, into a socket or slot in a connector 116.

Each electronic assembly 210 is mounted in a carrier 220 for testing, and the combination of electronic assembly 210 and carrier 220 forms test module 120. For bulk testing as shown in FIG. 1, multiple electronic assemblies 210 are mounted in respective carriers 220 to form multiple test modules 120 and 120A to 120Z, that may be simultaneously connected to tester 110.

Figure 4:
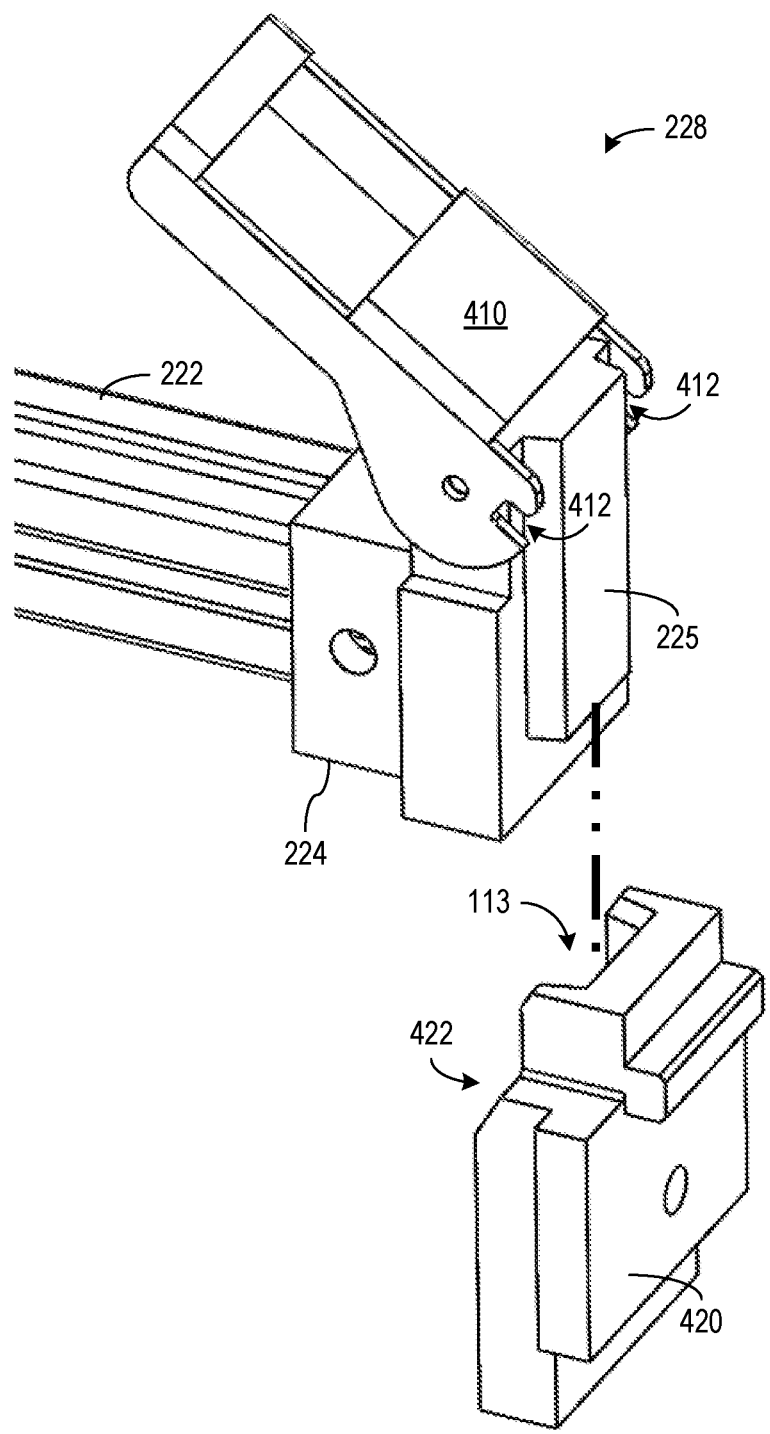
FIG. 4 is a perspective view illustrating insertion of a carrier end fitting into a tester guide in accordance with one example of the present disclosure.

Tester 110 may be a specialized test system that includes a large number or connectors 116 for testing many electronic assemblies 210. Tester 110 may test multiple assemblies 210 in parallel (simultaneously) or test connected assemblies 210 sequentially during a single test procedure. In the illustrated example, tester 110 includes a chassis 118 containing a motherboard 114, and motherboard 114 has connectors 116, e.g., sockets or slots, capable of accepting respective test modules 120 and 120A to 120Z. (FIG. 4, which is described further below, shows a top view of an example of tester 110 without any devices under test inserted to better illustrate some components in an example of tester 110.) Motherboard 114 may include test circuitry, e.g., one or more processors with interface circuits for connection to electronic assemblies 210 through connectors 116. The processors on motherboard 114 may execute a test program for testing the functions of electronic assemblies 210. To facilitate the installation and removal of test modules 120, chassis 118 of tester 110 may include a frame or mechanical guide 112 with guide features 113 (FIG. 4) that complement mechanical guiding features on carriers 220. For example, a guide feature may, for example, be a pad or tab 225 having a uniform or slightly tapered width. Tabs 225 are located at opposite ends of the carrier 220, and the tabs 225 on opposite ends of the carrier 220 may respectively engage or fit into a pair of uniform width or slightly tapered tracks or slots 113. A carrier 220 having tabs 225 engaged with slots 113 aligns the held electron assembly 210 to an associated connector 116 into which the test module 120 may be inserted. Tabs 225 of carrier 220 and tracks 113 of frame 112 may guide modules 112 and 120A to 120Z and may particularly align contacts on assemblies 210 for vertical insertion into respective connectors 116 in tester 100.

Figures 1, 2:
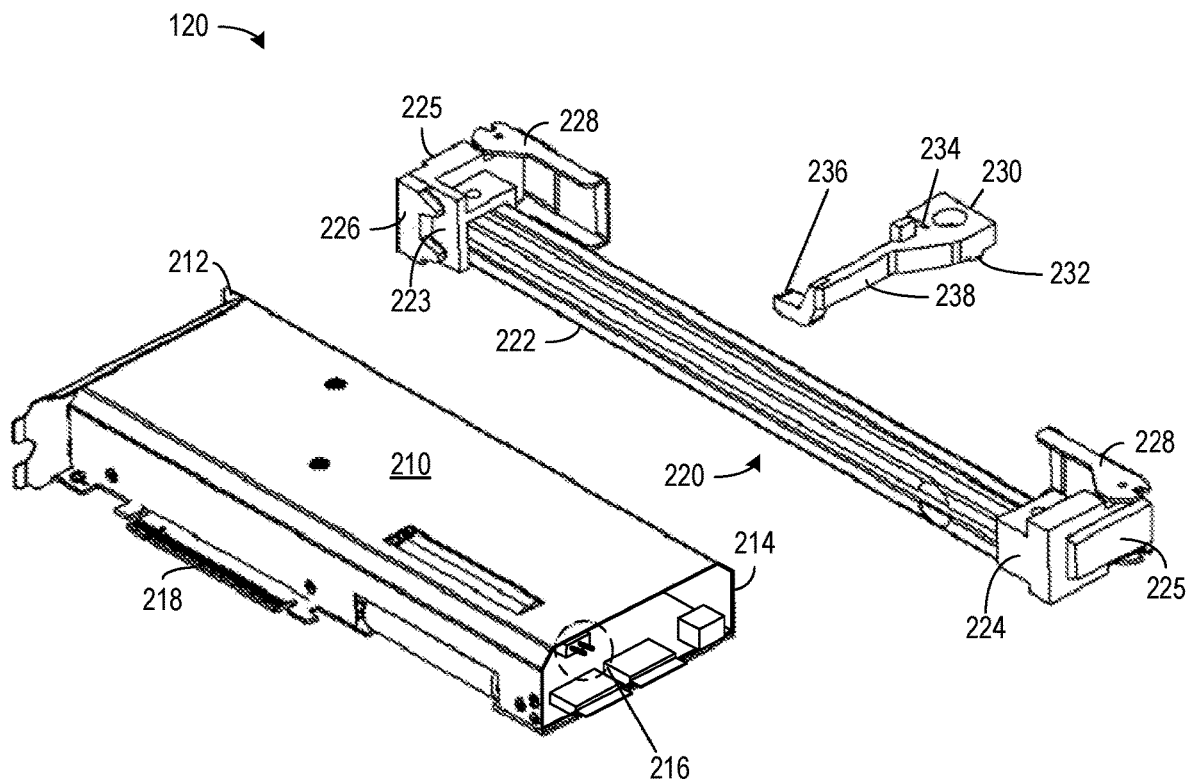
Figure 2:
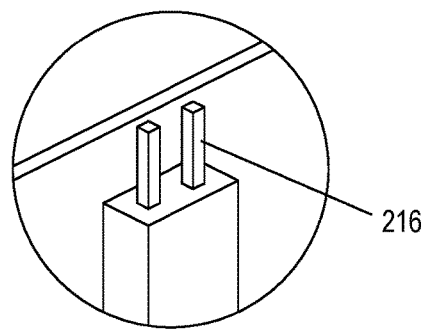
Figures 2, 3:
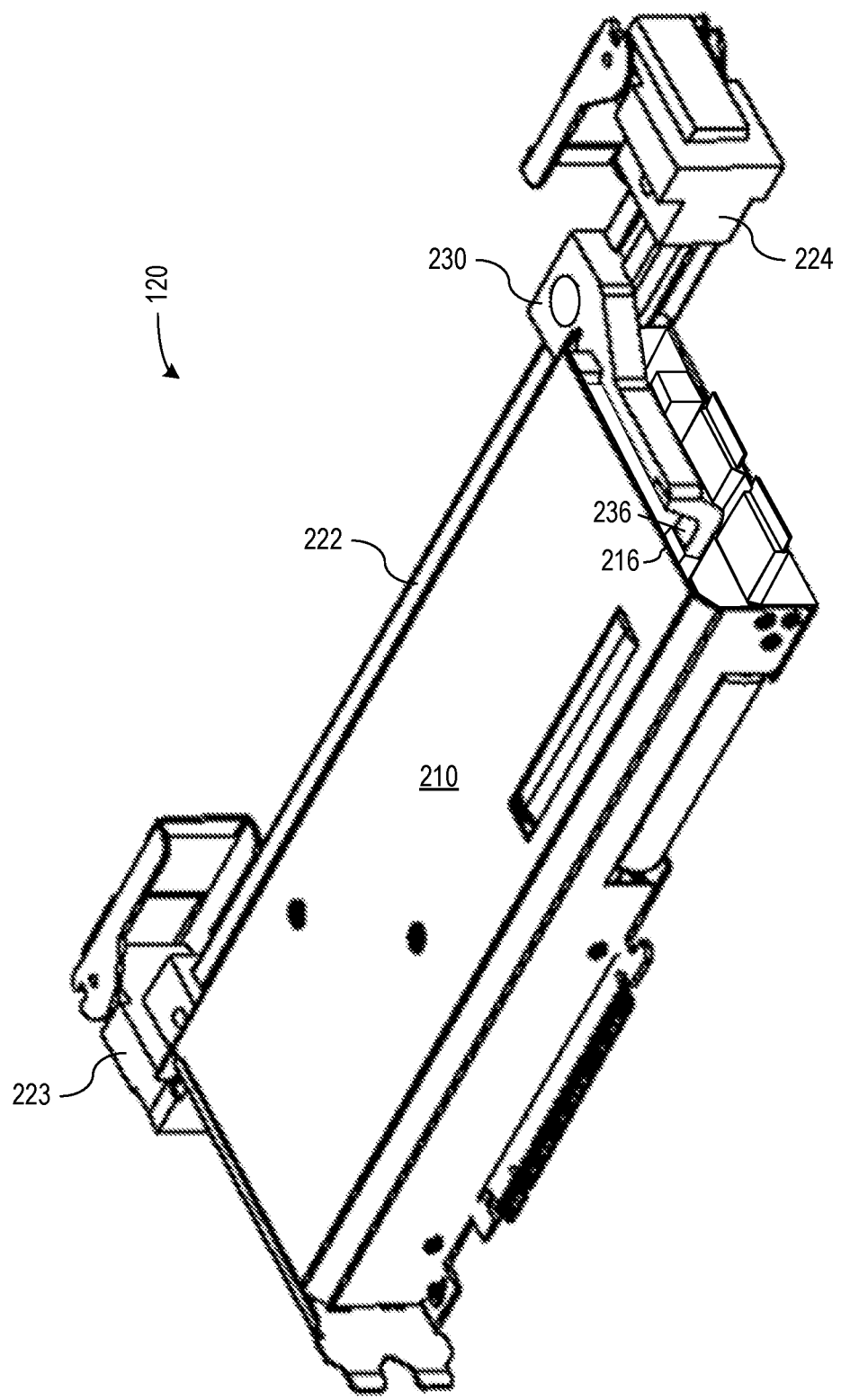
Figure 3:
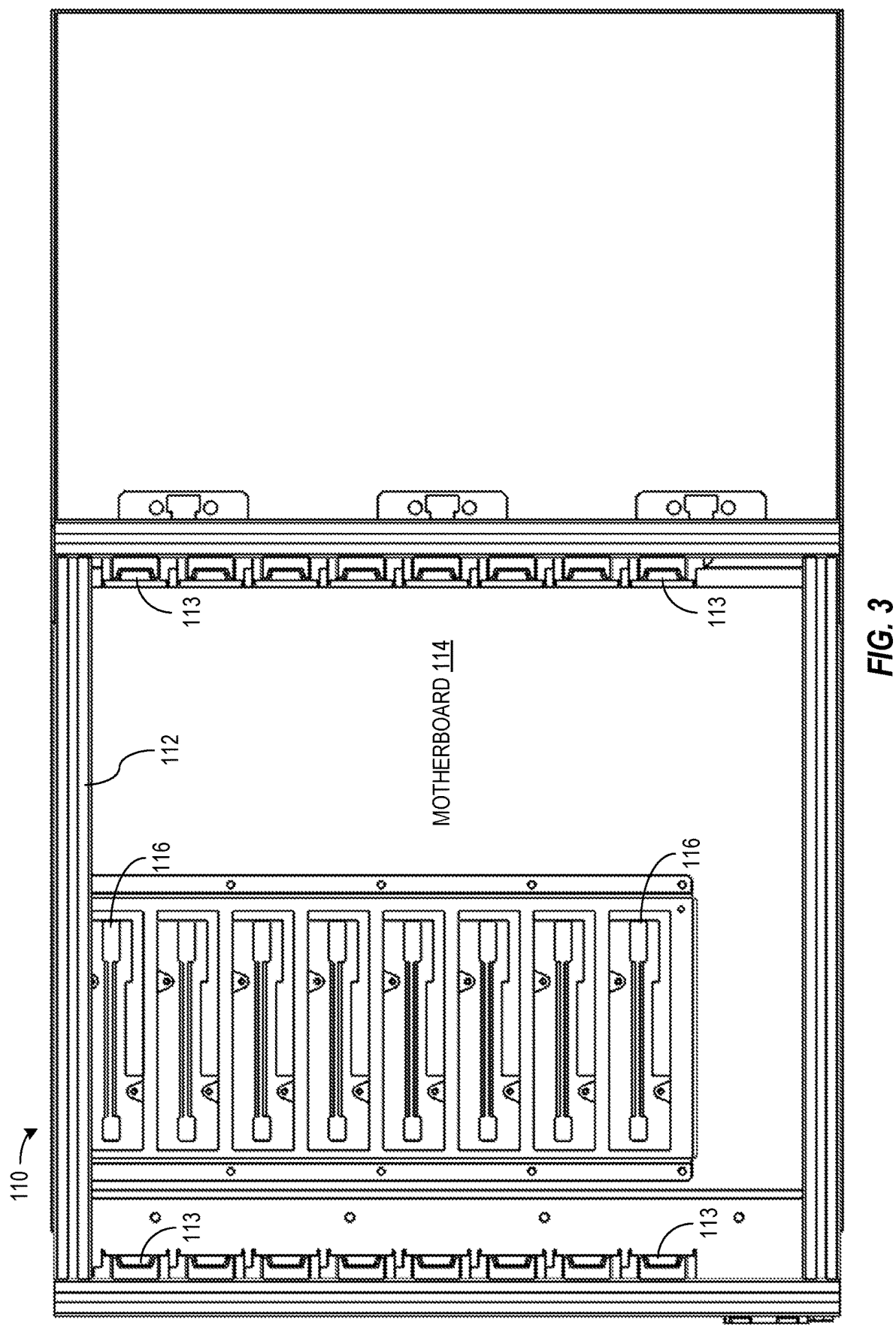

FIG. 2-1 and FIG. 2-3 respectively show exploded and assembled views of a test module 120 including an electronic assembly 210 and a carrier 220. Electronic assembly 210 is the device under test and in an example system, may be a PCI-e card for use in a server. A PCI card may be any type of device including, for example, a disk drive, a solid-state storage device, a storage controller, or a storage processing unit. Carrier 220 includes a main spine 222 with end fittings 223 and 224. The length of carrier 220 from end fitting 223 to end fitting 224 matches the available length in a tester, e.g., matches the distance between a pair of tracks 113 in tester 110 of FIGS. 1 and 3. End fitting 223 at one end of spine 222 includes a product retention feature 226 that is shaped to engage and hold a corresponding feature 212 of electronic assembly 210. For example, product retention feature 226 may include a slot, and feature 212 at one end of electronic assembly 210 may include a metal projection or tab that fits into the slot of retention feature 226. The length of carrier 220 is generally greater than a length of electronic assembly 210, and a retention clip 230, which may be slid along main spine 222 to as needed according to the length of the device under test, includes an opposing product retention feature 234 the engages a feature 214 at the other end of electronic assembly 210.

End fittings 223 and 224 include guide features 225 that are shaped to engage complementary guide features 113 on the tester 110, e.g., so that the carrier 220 in a test module 120 automatically positions and aligns contacts 218 of electronic assembly 210 to plug into a connector 116 in tester 110 as guide features 225 slide in guide features 113 of tester 110. Guide features 225 may, for example, be rectangular or slightly tapered (trapezoidal) pads sized to slide into tracks 113 in frame 112 of tester 110.

Figure 5:
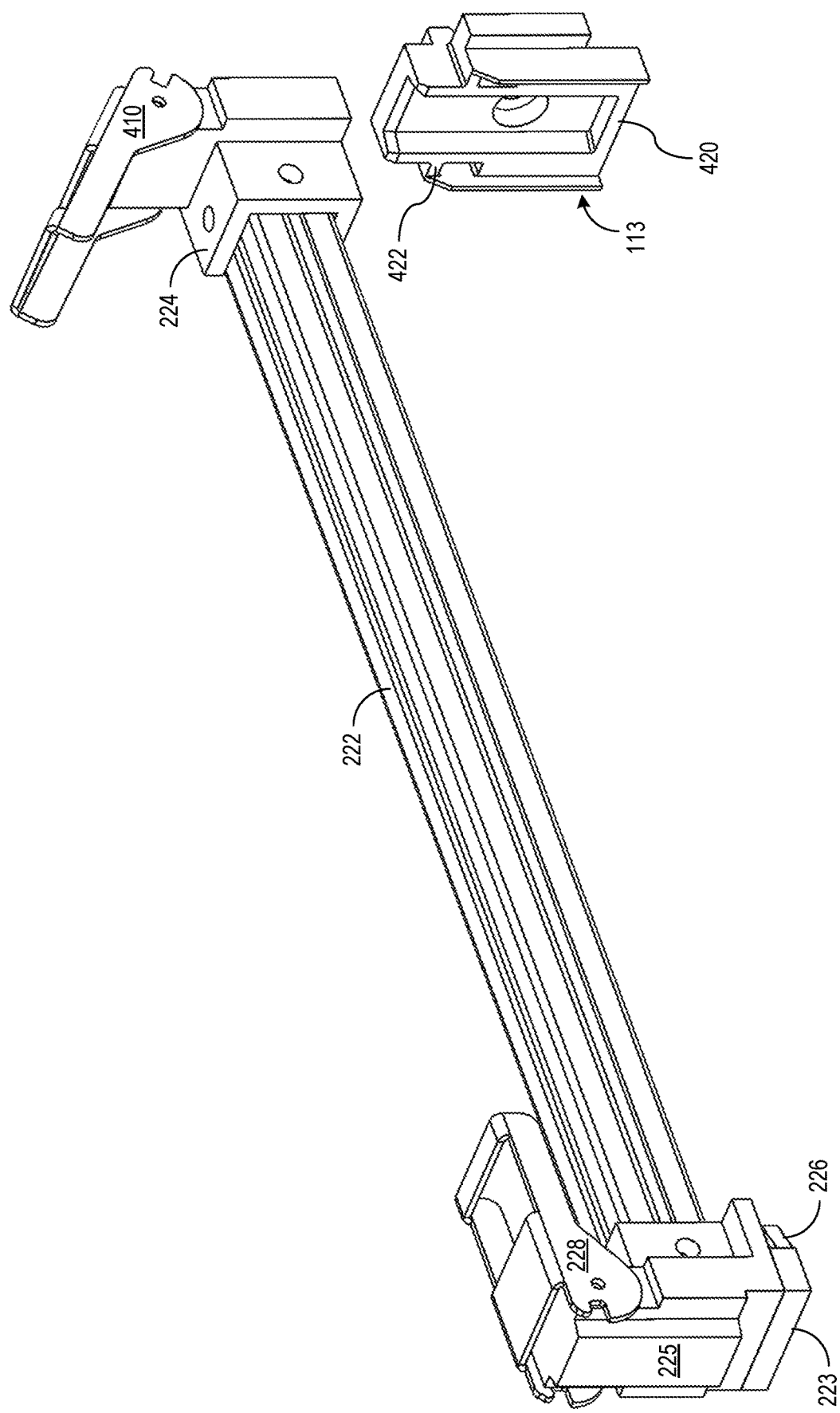
FIG. 5 is a perspective view showing a carrier and a tester guide in accordance with an example of the present disclosure.

Injector/ejector features 228 on end fittings 223 and 224 may engage features of tester 110, e.g., when contacts 218 begin to engage a connector 116. In the example shown in FIGS. 4 and 5, injector/ejector feature 228 include a lever 410 that pivots relative to a fulcrum or axel on an end fitting 223 or 224, and a slot or slots 412 in lever 410 engage projections or ridges 422 on a slot insert 420 on the tester. Each insert 420 attaches to the frame of the tester and includes or forms at least a portion of a guide feature 113. A pair of levers 410 at opposite ends of the carrier 220 can lock a test module 120 in place in tester 110 and provide a mechanical advantage when pushing contacts 218 into a connector 116 in tester 110 or when pulling or prying an electronic assembly 210 out of tester 110. Levers 410 may also provide a convenient and effective grip for removing an assembly 210 from the tester 110.

In accordance with an aspect of the present disclosure shown in FIGS. 2-1 and 2-3, retention clip 230 of a carrier 220 engages an end (e.g., the back or header) of electronic assembly 210 opposite from where end fitting 223 engages the electronic assembly 210. In the illustrated example, retention chip 230 and main spine 222 are shaped to provide an adjustable mount for mounting of retention clip 230 anywhere along the length of main spine 222 of carrier 220. For example, the adjustable mount may be a slide mount resulting from a projection 232 on retention clip 230 that fits into a track running along main spine 222 of carrier 220, so that retention clip 230 is able to slide along the track. A retaining screw or other structure may releasably lock retention clip 230 in place on main spine 222.

A process for mounting electronic assembly 210 in carrier 220, in one example of the present disclosure, includes engaging feature 212 of electronic assembly 210 with product retention feature 226 of end fitting 223 while main spine 222 extends along a length of electronic assembly 210, placing projection 232 in the track in main spine 222, and sliding retention clip 230 along main spine 222 until product retention feature 234 of retention clip 230 mechanically engages and holds feature 214 of electronic assembly 210 illustrated in FIGS. 2-1 and 2-3. At which point, retention clip 230 may be locked in place on main spine 222, and electronic assembly 210 is securely held in carrier 220.

In accordance with another aspect of the present disclosure, retention clip 230 includes an integrated activator 236 positioned to contact or engage a configuration component on electronic assembly 210 when retention feature 234 contacts electronic assembly 210, and retention clip 230 thereby automatically activates the configuration component and configures the operating mode of electronic assembly 210 for testing. Activator 236 in one example is a shunt, which may be a compliant conductive structure that electrically shorts a gap between configuration pins 216 on electronic assembly 210. In one example, retention clip 230 includes a rigid, insolating member 238 made of plastic or a metal with an insulating coating, and activator or shunt 236 includes a compliant, conductive member attached to rigid member 238 with a fastener or adhesive. A compliant shunt 236 could be constructed using a piece of thin metal formed into a leaf spring or using a foam block wrapped in electrically conductive fabric.

FIG. 2-2 shows an enlarged view of a pair of electrical configuration pins 216 on an electronic assembly 210. For the example using configuration using pins 216, activator 236 is a shunt integrated into retention clip 230, and rigid member 238 of retention clip 230 is shaped to automatically apply shunt 236 to configuration pins 216 when electronic assembly 210 is mounted in carrier 220. In one example of the present disclosure, retention clip 230 shorts pins 216 together to put electronic assembly 210 into a test or diagnostic mode. More generally, retention clip 230 and activator 236 may be shaped to automatically position one or more shunts in contact with one or more set of pins 216 on an electronic assembly 210 mounted in carrier 220 to place the mounted electronic assembly 210 in any mode desired for testing. Further, carrier 210 may employ different versions of retention clip 230 with different shapes to position one or more shunts 236 in different locations, for example, to short different sets of configuration pins on the same electronic assembly 210 for testing of different operating modes of the electronic assembly 210. Further, different versions of retention clip 230 may be shaped for testing of different types of electronic assembly 210 that have configuration pins 216 in different locations. When the retention clip 230 is installed to hold an electronic assembly 210, retention clip 230 secures the electronic assembly 210 to carrier 220 and automatically electrically shorts two or more pins 216 on the header of electronic assembly 210 without the need of a worker to separately set a jumper or switch to select the operating mode of the electronic assembly 210.

In an alternative example, a retention clip may be shaped to contact and depress or activate a bottom or switch that may be provided on an electronic assembly. In this case for carrier 220, activator 236 may not require a shunt, and activator 236 at the end of rigid member 238 may be shaped according to the location and shape of one or more configuration switches or buttons that need to be set to control the operating mode of electronic assembly 210.

Removal of electronic assembly 210 from the carrier 220 automatically removes activator 236 from electronic assembly 210, e.g., removes the shunt from the header pins 216 or removes pressure from configuration switches or buttons, so that electronic assembly 210 defaults back to a normal operating mode when testing is complete. A worker is not needed to separately set a jumper or switch to return electronic assembly 210 to the default operating mode. Accordingly, manufacturing failures where electronic assemblies 210 are unintentionally left in a test mode after testing may be automatically avoided.

Although example implementations have been disclosed to illustrate aspects of the present disclosure, these implementations are only examples and should not be taken as limitations. Other implementations of the disclosed examples may be employed. For example, although the illustrated configuration employs a shunt or shunts on a retention clip with a slide mounting, an alternative configuration may employ a shunt fixed on a structure such as an end fitting that is fixed relative to the main spine of the carrier. Various other adaptations and combinations of features of the implementations disclosed are within the scope of the following claims.

What is claimed is:

1. A carrier for insertion of a device under test into a tester, the carrier comprising:
   a first engagement structure and a second engagement structure shaped to engage and hold the device under test in the carrier; and
   a shunt integrated into the carrier and positioned to electrically contact and short together pins on the device under test, the pins being shorted setting an operating mode to enable an operation to be performed using a circuit of the device under test.

2. The carrier of claim 1, wherein:
   the first engagement structure comprises a first end fitting and a spine extending from the first end fitting, the first end fitting including a first engagement feature shaped to engage a first portion of the device under test; and
   the second engagement structure comprises a retention clip with a slide mount on the spine, the retention clip including:
   a second engagement feature shaped to engage a second portion of the device under test; and
   the shunt, the shunt being positioned on the retention clip to contact and short the pins on the device under test when the second engagement feature is engaged with the device under test.

3. The carrier of claim 2, wherein the retention clip comprises a rigid member with a projection shaped to engage a track on the spine.

4. The carrier of claim 3, wherein:
   the shunt is mounted on the retention clip;
   the retention clip electrically insulates the shunt from the spine; and
   the retention clip extends is shaped to position the shunt to contact the pins on the device under test when the second engagement feature is engaged with the device under test.

5. The carrier of claim 2, wherein the first engagement structure further comprises a second end fitting on a side of the spine opposite from the first end fitting.

6. The carrier of claim 5, where the first end fitting and the second end fitting comprise respective guide features shaped to couple with respective tracks in the tester, the guide features coupled with the tracks to align contacts on the device under test with an electrical connector of the tester.

7. The carrier of claim 5, where each of the first end fitting and the second end fitting comprises a fulcrum and a lever that pivots on the fulcrum, each of the levers including a feature shaped to engage the tester and provide a mechanical advantage when the device under test is being inserted into or removed from the tester.

8. The carrier of claim 1, wherein the device under test comprises a printed circuit board with contacts shape for insertion into a slot in a computer.

9. The carrier of claim 1, wherein the device under test is selected from a group consisting of a PCI card, a disk drive, a solid-state storage device, a storage processing unit, a printed circuit board with a blind-mate connector or contact shapes that is part of a larger assembly that functions as a pluggable module, and a device or subassembly of a device with a blind-mate connector and configurable jumpers that are used during testing of the device.

10. A carrier comprising:
a spine;
a first fitting attached to the spine, the first fitting including a first engagement feature shaped to engage a first portion of a device under test; and
a retention clip with a slide mount on the spine, the retention clip including:
a second engagement feature shaped to engage a second portion of the device under test to hold the device under test between the retention clip and the first fitting; and
an activator positioned on the retention clip to contact and activate a configuration component on the device under test when the second engagement feature is engaged with the second portion of the device under test, wherein the activation of the configuration component enables an operation to be performed using a circuit of the device under test.

11. The carrier of claim 10, further comprising a second fitting attached to the spine, wherein the first fitting and the second fitting are shaped to engage a tester during testing of the device under test.

12. The carrier of claim 11, wherein each of the first fitting and the second fitting comprises a guide feature shaped to engage respective tracks in the tester to thereby align the device under test for electrical connection to a connector in the tester.

13. The carrier of claim 10, wherein the activator comprises a shunt and the configuration component comprises pins that the shunt contacts and shorts together to thereby configure the device under test for testing.

14. A method comprising:
engaging a first portion of a device under test with a first engagement feature on a carrier;
moving a retention clip on the carrier until a second engagement feature on the carrier engages a second portion of the device under test and a shunt on the carrier contacts and shorts together configuration pins on the device under test;
installing a module including the carrier and the device under test in a tester; and
operating the tester to test the device under test while the shunt shorts together the configuration pins, wherein the tester enables an operation to be performed using a circuit of the device under test.

15. The method of claim 14, wherein moving the retention clip comprises sliding the retention clip along a track that extends toward the first engagement feature.

16. The method of claim 14, wherein shorting together the configuration pins together places the device under test into a test mode in which the device under test operates while the tester tests the device under test.

17. The method of claim 16, further comprising after the tester tests the device under test, removing the device under test from the carrier, wherein removing the device removes the shunt from contact with the configuration pins thereby placing switching the device under test out of the test mode.

* * * * *